United States Patent [19]

Iwashita

[11] Patent Number: 5,295,116
[45] Date of Patent: Mar. 15, 1994

[54] ROW ADDRESS DECODER AND WORD LINE DRIVER UNIT WITH PULL-DOWN TRANSISTORS OPERABLE IN SATURATION REGION FOR RAPIDLY DRIVING WORD LINES

[75] Inventor: Shinichi Iwashita, Tokyo, Japan
[73] Assignee: NEC Corporation, Tokyo, Japan
[21] Appl. No.: 54,221
[22] Filed: Apr. 30, 1993

[30] Foreign Application Priority Data
May 1, 1992 [JP] Japan .................................. 4-112775

[51] Int. Cl.$^5$ ............................................ G11C 11/407
[52] U.S. Cl. ............................ 365/230.06; 365/189.06
[58] Field of Search ........................ 365/230.06, 189.06

[56] References Cited

U.S. PATENT DOCUMENTS

| | | | |
|---|---|---|---|
| 4,811,304 | 3/1989 | Matsuda et al. ................ | 365/230.06 |
| 5,051,959 | 9/1991 | Nakano ett al. ................ | 365/230.06 |
| 5,214,602 | 5/1993 | Lines ............................ | 365/230.06 X |

*Primary Examiner*—Eugene R. LaRoche
*Assistant Examiner*—Christopher R. Glembocki
*Attorney, Agent, or Firm*—Sughrue, Mion, Zinn, Macpeak & Seas

[57] ABSTRACT

A row address decoder and word line driver unit selectively drives a word line selected from one of a plurality sets of word lines, and comprises a plurality of row address decoders and word line driver sub-units for selecting a set of word lines and a plurality of address decoder sub-units for selecting a word line from the selected set of word lines, wherein a pair of p-channel enhancement type transfer transistors coupled between a selected row address decoder and word line driver unit and the selected word line are switched by a selected address decoder sub-unit for supplying a word line driving signal, the complementary word line driving signal switches an n-channel enhancement type first pull-down transistor coupled between the selected word line and a ground voltage line, and the selected address decoder sub-unit further switches an n-channel enhancement type second pull-down transistor, thereby charging to and discharging from the selected word line through the transistors operable in the saturation region.

5 Claims, 7 Drawing Sheets

ROW ADDRESS DECODER AND WORD LINE DRIVER UNIT WITH PULL-DOWN TRANSISTORS OPERABLE IN SATURATION REGION FOR RAPIDLY DRIVING WORD LINES

FIELD OF THE INVENTION

This invention relates to a row address decoder and word line driver unit incorporated in a semiconductor memory device and, more particularly, to a row address decoder and word line driver unit with discharging transistors for rapidly driving word lines.

DESCRIPTION OF THE RELATED ART

A typical example of the row address decoder and word line driver unit is disclosed in Japanese Patent Application No. 62-165663, and is illustrated in FIG. 1 of the drawings. The row address decoder and word line driver unit is responsive to address predecoded signals produced from an (m+n) bit row address signal by an address buffer circuit (not shown), and drives one of the $2^{m+n}$ word lines to a power voltage level Vcc. The other word lines remain the ground voltage level.

In detail, the (m+n) bit row address signal are predecoded to the address predecoded signals A1 to Am+n identical in logic level to the (m+n) bits and the address predecoded signals CA1 to CAm+n complementary to the (m+n) bit, and are selectively supplied to $2^n$ row address decoder and word line driver sub-units, and each row address decoder and word line driver sub-units has a pair of address decoder/ driver circuits. In the following description and the drawings attached to the specification, suffix "q" is assumed to be equal to $2^n$, and suffix "p" is assumed to be equal to $2^m$. The address decoder/driver circuits 11L to 1qL are respectively paired with the address decoder/driver circuits 11R to 1qR. The address decoder/driver circuit 11L is implemented by a series combination of an n-input NAND gate NA1L and an inverter INV11L, and the address predecoded signals CAm+1, CAm+2, . . . and CAm+n are supplied to the input nodes of the NAND gate NA1L. The address decoder/driver circuit 11L thus arranged lifts an output node W01L to the power voltage level Vcc when all of the address predecoded signals CAm+1 to CAm+n are logic "1" level corresponding to high voltage level. Similarly, the address decoder/driver circuit 11R is implemented by a series combination of an n-input NAND gate NA1R and an inverter INV11R, and the address predecoded signals CAm+1, CAm+2, . . . and CAm+n are supplied to the input nodes of the NAND gate NA1R. The address decoder/driver circuit 11R also lifts an output node W01R to the power voltage level Vcc when all of the address predecoded signals CAm+1 to CAm+n are logic "1" level. The other row address decoder and word line driver sub-units are similar in arrangement to the row address decoder and word line driver sub-unit 11L and 11R, and lift the associated output nodes such as W0qL and W0qR to the power voltage level in the co-presence of the address predecoded signals of logic "1".

When the row address signal is supplied to the address buffer circuit, only one combination consists of the address predecoded signals of logic "1" level, and allows one of the row address decoder and word line driver sub-units to lift the associated output nodes to the high voltage level. The other combinations contains at least one address predecoded signal of logic "0" level, and the ($2^n$−1) row address decoder and word line driver sub-units keep the associated output nodes in the ground voltage level.

The address predecoded signals A1 to Am and CA1 to CAm are selectively supplied to 2m row address decoder sub-units 21 to 2p, and each of the row address decoder sub-units 21 to 2p is implemented by a series combination of an m-input NOR gate NR1, . . . or NRp and an inverter INV21, . . . or INV2p. When the row address signal is supplied to the address buffer circuit, only one combination consists of the address predecoded signals of logic "0" level, and allows the row address decoder sub-unit to lift the associated output node T1, . . . or Tp to go down to the ground voltage level. However, the other row address decoder sub-units keep the associated output nodes in the power voltage level Vcc. The voltage levels at the output nodes T1 to Tp serve as gate control signals CTL1 to CTLp. The output nodes T1 to Tp are respectively coupled with inverters INVB1 to INVBp, and the inverters INVB1 to INVBp produces the complementary gate control signals CCTL1 to CCTLp.

The output nodes W01L to W0qL are coupled with p-channel enhancement type transfer transistors P1 to Pp, and the gate control signals CTL1 to CTLp are respectively supplied to the gate electrodes of the p-channel enhancement type transfer transistors P1 to Pp. Similarly, the output nodes W01R to W0qR are respectively coupled with n-channel enhancement type transfer transistors N1R to NpR, and the complementary gate control signals CCTL1 to CCTLp are supplied to the gate electrodes of the n-channel enhancement type transfer transistors N1R to NpR, respectively. Between the p-channel enhancement type transfer transistors P1 to Pp and the n-channel enhancement type transfer transistors N1R to NpR extend word lines which are respectively labeled with "WL1" to "WLp".

N-channel enhancement type pull-down transistors N1C to NpC are respectively coupled between the word lines WL1 to WLp and the ground voltage line, and the gate control signals CTL1 to CTLp are supplied to the gate electrodes of the n-channel enhancement type pull-down transistors N1C to NpC. Though not shown in FIG. 1, read-out voltage levels are applied to the p-channel enhancement type transfer transistors P1 to Pp as back gate bias voltages, and the ground voltage level is applied to the n-channel enhancement type transfer transistors N1R to NpR and the n-channel enhancement type pull-down transistors N1C to NpC as the back gate bias voltages. W1L to WpL and W1R to WpR are indicative of parts of the word lines WL1 to WLp between the p-channel enhancement type transfer transistors P1 to Pp and the n-channel enhancement type pull-down transistors N1C to NpC and parts of the word lines WL1 to WLp between the n-channel enhancement type pull-down transistors N1C to NpC and the n-channel enhancement type transfer transistors N1R to NpR. W1C to WpC stand for the drain nodes of the n-channel enhancement type pull-down transistors N1C to NpC.

Although description is made on the word lines W1L to WLp and the associated transistors P1 to Pp, N1R to NpR and N1C to NpC provided in association with the address decoder/driver circuits 111 and 11R, the other address decoder/driver circuits are accompanied with word lines, p-channel enhancement type transfer transistors, n-channel enhancement type transfer transistors and n-channel enhancement type pull-down transistors arranged in similar manner, and the gate control signals CTL1 to CTLp and the complementary gate control signals CCTL1 to CCTLp are distributed to the transistors associated with the other address decoder/driver circuits.

The prior art row address decoder and word line driver unit thus arranged macroscopically behaves as follows. Assuming now that the row address signal is indicative of the row address assigned to the word line WL1, all of the address predecoded signals CA1, CA2, ... and CAm are logic "0" level, and the address predecoded signals CAm+1 to CAm+n are logic "1" level. The address decoder/driver circuits 11L and 11R drive the output nodes W01L and W01R to the power voltage level Vcc, and the other output nodes W0qL to W0qR remain in the ground voltage level. The row address decoder sub-unit 21 produces the gate control signal CTL1 of logic "0" level corresponding to the ground voltage level, and the complementary gate control signal CCTL1 of logic "1" level corresponding to the power voltage level Vcc takes place at the output node of the inverter INVB1. However, the other row address decoder sub-units keep the gate control signals such as CTLp in the power voltage level Vcc, and the complementary gate control signals are in the ground voltage level.

With the gate control signal CTL1 of the ground voltage level and the complementary gate control signal CCTL1, the p-channel enhancement type transfer transistor P1 and the n-channel enhancement type transfer transistor N1R turn on so that the output nodes of the power voltage level Vcc are coupled with the word line WL1. The gate control signal CTL1 of the ground voltage level keeps the n-channel enhancement type pull-down transistor N1C off, and the selected word line WL1 is driven to the power voltage level Vcc.

However, the other gate control signals CTLp of the power voltage level Vcc keep the other p-channel enhancement type transfer transistors Pp off, and the complementary gate control signals CCTLp thereof also keep the other n-channel enhancement type transfer transistors NpR off. On the contrary, the n-channel enhancement type pull-down transistors N1C to NpC turn on in the presence of the gate control signals CTLp of the power voltage level, and the word lines WLp are decayed to the ground voltage level.

If the row address signal is indicative of another word line, the word line WL1 is decayed to the ground voltage level, and the selected word line is driven to the power voltage level.

An n-channel enhancement type field effect transistor increases the drain current Ids together with the differential voltage Vds between the source and the drain under the gate-to-source bias voltage Vgs equal to the differential voltage Vds, and the drain current Ids traces Plots ID1 in the saturation region or the bias voltage Vgs over the threshold level Vth. In the saturation region, the drain current Ids is substantially proportional to the square of the difference between the differential voltage Vds and the threshold level Vth, i.e., $(Vds-Vth)^2$. On the other hand, the channel resistance Rc of the n-channel enhancement type field effect transistor is inversely proportional to the square of the difference as indicated by Plots R1 under the gate-to-source bias voltage Vgs equal to the differential voltage Vds, and is expressed as $Vds/(Vds-Vth)^2$. Therefore, if the bias voltage Vgs becomes closer to the threshold Vth, the channel resistance Rc is increased. The channel resistance Rc is infinity at the threshold level Vth, and, the n-channel enhancement type field effect transistor turns off.

The n-channel enhancement type field effect transistor behaves as shown in FIGS. 4 and 5 in the linear region. Namely, if the differential voltage Vds is less than the difference between the bias voltage Vgs and the threshold level Vth, the n-channel enhancement type field effect transistor increases the drain current Ids together with the differential voltage Vds along Plots ID2, and the drain current Ids is proportional to $\{(Vgs-Vth)Vds-Vds^2/2\}$. On the other hand, the channel resistance Rc varies along Plots R2, and is expressed as $1/\{(Vgs-Vth)-Vds/2\}$. The channel resistance R(0) at Vds=0 is half of the channel resistance 2R(0) at Vds=Vgs−Vth. Therefore, the channel resistance Rc is proportional to the differential voltage Vds in the linear region, and is inversely proportional to the differential voltage Vds in the saturation region. A p-channel enhancement type field effect transistor is analogous to the n-channel enhancement type field effect transistor, and the channel resistance of the p-channel enhancement type field effect transistor is proportional to the differential voltage Vds in the linear region and inversely proportional in the saturation region.

The transistor characteristics discussed above are taken into account of, and the circuit behavior of the prior art row address decoder and word line driver unit is microscopically analyzed with reference to FIGS. 6 and 7. Assuming again that the row address signal is indicative of the row address assigned to the word line WL1, the address decoder/driver circuits 11L and 11R drive the output nodes W0L and W0R toward the power voltage level Vcc, and the row address decoder sub-unit 21 allows the output node T1 to go down to the ground voltage level. As a result, the output nodes W01L and W01R start rising at time t1, and the gate control signal CTL1 concurrently starts decaying. The inverter INVB1 immediately increases the voltage level of the complementary gate control signal CCTL1. The gate control signal CTL1 and the complementary gate control signal CCTL1 allows the p-channel enhancement type transfer transistor P1 and the n-channel enhancement type transfer transistor N1R to turn on, and the n-channel enhancement type pull-down transistor N1C turns off. Therefore, the output nodes W01L and W01R are electrically coupled through the transfer transistors P1 and N1R with the parts W1L and W1R of the selected word line WL1, and the parts W1L and W1R of the word line WL1 and the drain node W1C start rising toward the power voltage level Vcc at time t1.

Since the output nodes, W01L and W01R are saturated at high voltage level approximately equal to the power voltage level Vcc, the p-channel enhancement type transfer transistor P1 transfers current from the output node W01L to the part W1L of the word line WL1 under the bias voltage Vgs=−Vcc, and the part W1L is rapidly charged to the high voltage level, because the bias voltage Vgs fixed to −Vcc keeps the channel resistance Rc small.

On the other hand, the output node W01R and the complementary gate control signal CCTL1 go up to the high voltage level, and the n-channel enhancement type transfer transistor N1R transfers current from the output node W01R to the part W1R of the word line WL1 under the bias voltage Vgs=Vds. However, the bias voltage Vgs is decreased with time, and the channel resistance Rc is increased as indicated by Plots R1. Moreover, if the part W1R of the word line WL1 becomes higher than (Vcc−Vth), the n-channel enhancement type transfer transistor N1R turns off, and only the p-channel enhancement type transfer transistor P1 charges the word line WL1. In other words, the p-channel enhancement type transfer transistor P1 pulls up the word line WL1 over the threshold level Vth of the n-channel enhancement type transfer transistor N1R. For this reason, the part W1L of the word line WL1 reaches the high voltage level at time t2, and the drain node W1C reaches the high voltage level at time t3. However, the part W1R of the word line WL1 is delayed, and reaches the high voltage level at time t4. Thus, the time delay is introduced into the propagation of voltage level on the selected word line, and the selected word line is unstable between time t1 to t4.

After time t4, the word line WL1 is assumed to be non-selected, and the address decoder/driver circuits 11L and 11R changes the output nodes W01L and W01R to the ground voltage level at time t5. However, the row address decoder sub-unit 21 and the inverter INVB1 are assumed to keep the gate control signal CTL and the complementary gate control signal CCTL1 low and high, respectively. As a result, the bias voltage Vgs for the n-channel enhancement type transfer transistor N1R is fixed to the power voltage level Vcc, and the bias voltage Vgs and the differential voltage Vds of the p-channel enhancement type transfer transistor P1 are variable depending upon discharge from the part W1L of the word line WL1. The fixed bias voltage Vgs keeps the channel resistance Rc of the n-channel enhancement type transfer transistor N1R small, and the part W1R of the word line WL1 rapidly reaches the ground voltage level at time t6. However, the p-channel enhancement type transfer transistor P1 increases the channel resistance Rc with time, and turns off at time t7 when the part W1L of the word line WL1 reaches the threshold level Vth. Therefore, only the n-channel enhancement type transfer transistor N1R discharges the electric charges from the word line WL1, and the voltage decay on the word line WL1 is slow down. The drain node W1C reaches the ground voltage level at time t8, and the part W1L of the word line WL1 at time t9. Thus, time delay is introduced again, and the word line WL1 is unstable from time t5 to time t9.

While the address decoder/driver circuits 11L and 11R are supplying current to the word line WL1, the row address decoder sub-unit 21 may become non-selected. In this situation, the output nodes W01L and W01R are continuously charged by the address decoder circuits 11L and 11R, and the row address decoder sub-unit 21 and the associated inverter INVB1 changes the gate control signal CTL1 and the complementary gate control signal CCTL1 to the high voltage level and the ground voltage level at time 10 as shown in FIG. 7. The p-channel enhancement type transfer transistor P1 and the n-channel enhancement type transfer transistor N1R turn off, and the bias voltage Vgs of the n-channel enhancement type pull-down transistor N1C is fixed around the power voltage level Vcc. As a result, the n-channel enhancement type pull-down transistor N1C keeps the channel resistance Rc small, and rapidly discharges the accumulated electric charges from the word line WL1. Therefore, the drain node W1C rapidly reaches the ground voltage level at time t11. However, time delay is introduced, and the parts W1L and W1R of the word line WL1 reach the ground voltage level at time t12.

As will be understood from the foregoing description, gradation takes place on the word lines in the transient period. Each of the word lines is coupled with a row of memory cells, and the gradation on the word line introduces time delay into switching actions of the associated memory cells. This means that a substantial amount of time is consumed in selection of a word line, and the prior art semiconductor memory device suffers from low access speed.

SUMMARY OF THE INVENTION

It is therefore an important object of the present invention to provide a row address decoder and word line driver unit which accelerates selection of a word line.

To accomplish the object, the present invention proposes to allow transistors to charge and discharge a selected word line in saturation region.

In accordance with the present invention, there is provided a row address decoder and word line driver unit for selectively driving a plurality sets of word lines, word lines respectively selected from the plurality sets of word lines forming in combination a group of word lines so that the plurality sets of word lines being rearranged into a plurality groups of word lines, comprising: a) a plurality of row address decoder and word line driver sub-units respectively associated with the plurality sets of word lines, and having a-1) a plurality of first address decoder and driver circuits respectively coupled with first common nodes each shared between one of the plurality sets of word lines, and a-2) a plurality of second address decoder and driver circuits respectively paired with the plurality of first address decoder and driver circuits, and respectively coupled with second common nodes each shared between one of the plurality sets of word lines at the opposite ends to the first common nodes, the plurality of first address decoder and driver circuits and the plurality of second address decoder and driver circuits being responsive to first address predecoded signals for supplying a word line driving signal to one of the first common nodes and one of the second common nodes, a complementary signal of the word line driving signal being produced by one of the plurality of first address decoder and driver circuits; b) a plurality of row address decoder sub-units respectively associated with the plurality groups of word lines, and responsive to second address predecoded signals for producing a gate control signal; c) a plurality groups of first transfer transistors of one channel conductivity type respectively associated with the plurality of row address decoder sub-units, and respectively coupled between the first common nodes and the plurality groups of word lines, one of the plurality groups of first transfer transistors indicated by the second address predecoded signals being responsive to the gate control signal for coupling the first common nodes with the associated group of word lines; d) a plurality groups of second transfer transistors of the one channel conductivity type respectively associated with the plurality of row address decoder sub-units, and respectively coupled between the second common nodes and the plurality groups of word lines, one of the plurality groups of second transfer transistors indicated by the second address predecoded signals being responsive to the gate control signal for coupling the second common nodes with the associated group of word lines;
e) a plurality sets of first switching transistors of the opposite channel conductivity type respectively associated with the plurality of first address decoder and driver circuits, and respectively coupled between the plurality sets of word lines and a constant voltage line, one of the plurality sets of first switching transistors being responsive to the complementary signal of the word line driving signal for coupling the associated set of word lines with the constant voltage line; and f) a plurality groups of second switching transistors of the opposite channel conductivity type respectively associated with the plurality of address decoder sub-units, and respectively coupled between the plurality groups of word lines and the constant voltage line, one of the plurality groups of second switching transistors being responsive to the gate control signal for coupling the associated group of word lines with the constant voltage line.

BRIEF DESCRIPTION OF THE DRAWINGS

The features and advantages of the row address decoder and word line driver unit according to the present invention will be more clearly understood from the following description taken in conjunction with the accompanying drawings in which.

DESCRIPTION OF THE PREFERRED EMBODIMENTS

First Embodiment

Figure 1:
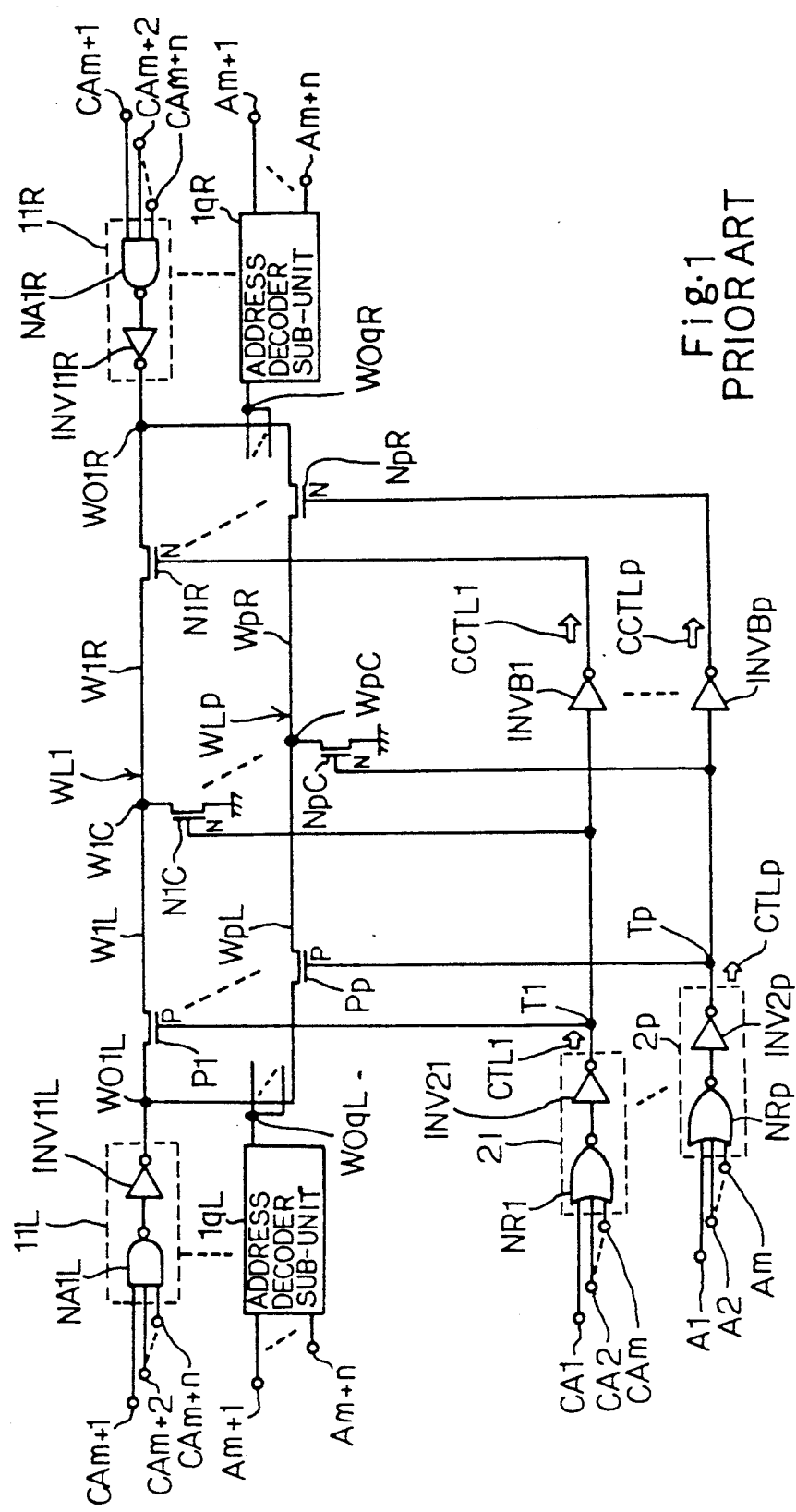
FIG. 1 is a circuit diagram showing the arrangement of the prior art row address decoder and word line driver unit.
Figure 2:
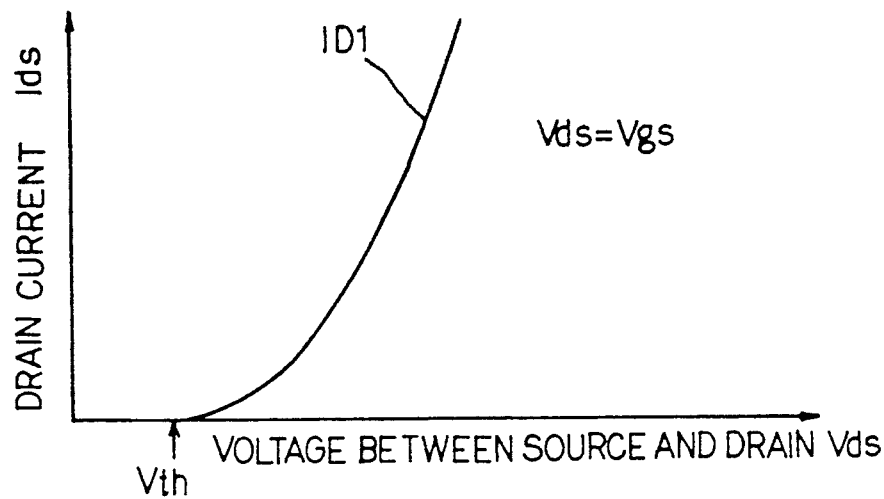
FIG. 2 is a graph showing the drain current in terms of the differential voltage between the source and the drain of the n-channel enhancement type field effect transistor in the saturation region.
Figure 3:
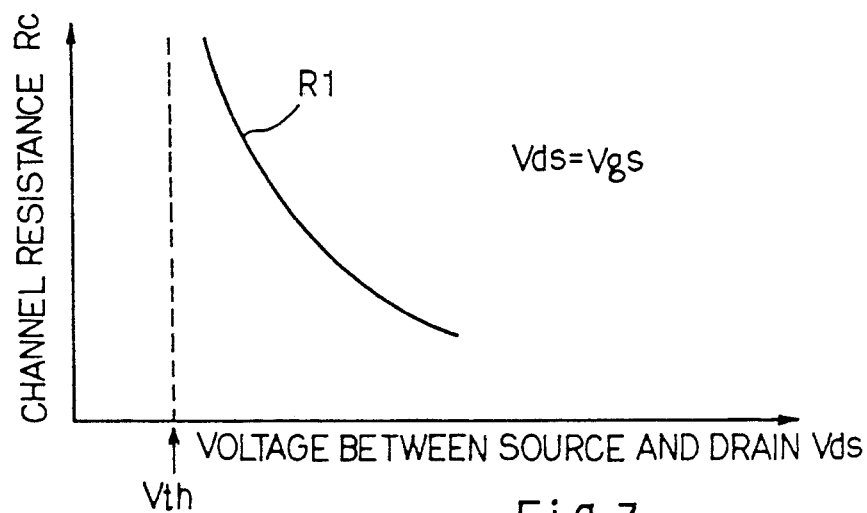
FIG. 3 is a graph showing the channel resistance in terms of the differential voltage between the source and the drain of the n-channel enhancement type field effect transistor in the saturation region.
Figure 4:
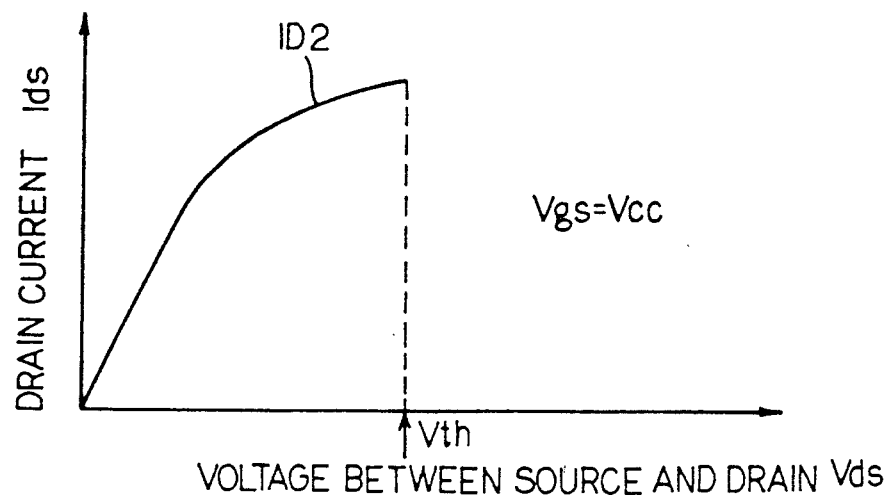
FIG. 4 is a graph showing the drain current in terms of the differential voltage between the source and the drain of the n-channel enhancement type field effect transistor in the linear region.
Figure 5:
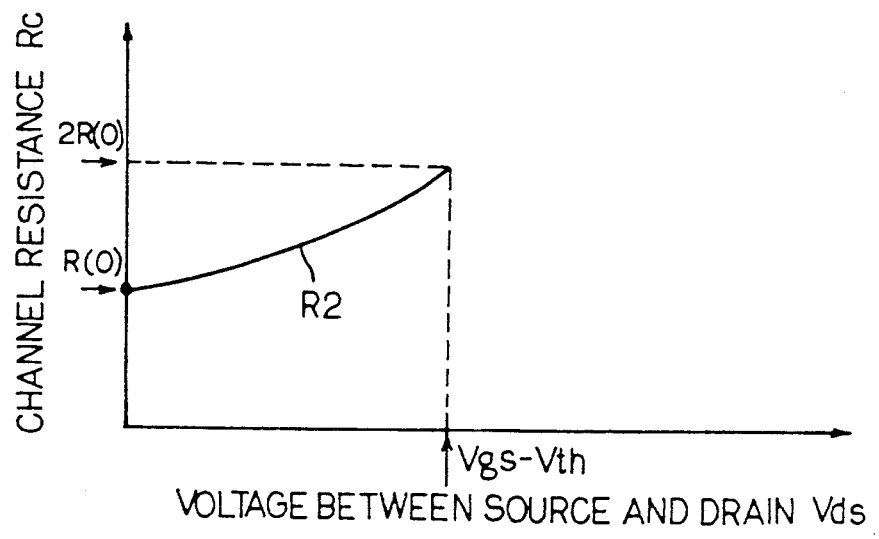
FIG. 5 is a graph showing the channel resistance in terms of the differential voltage between the source and the drain of the n-channel enhancement type field effect transistor in the linear region.
Figure 6:
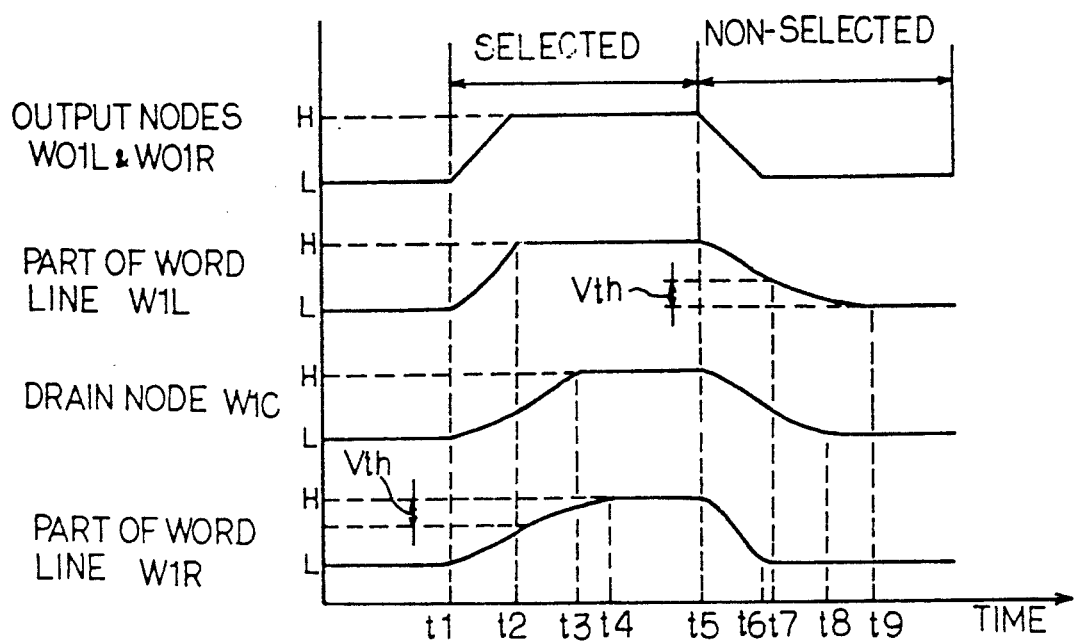
FIG. 6 is a diagram showing the waveforms on the word line selected by the prior art row address decoder and word line driver unit.
Figure 7:
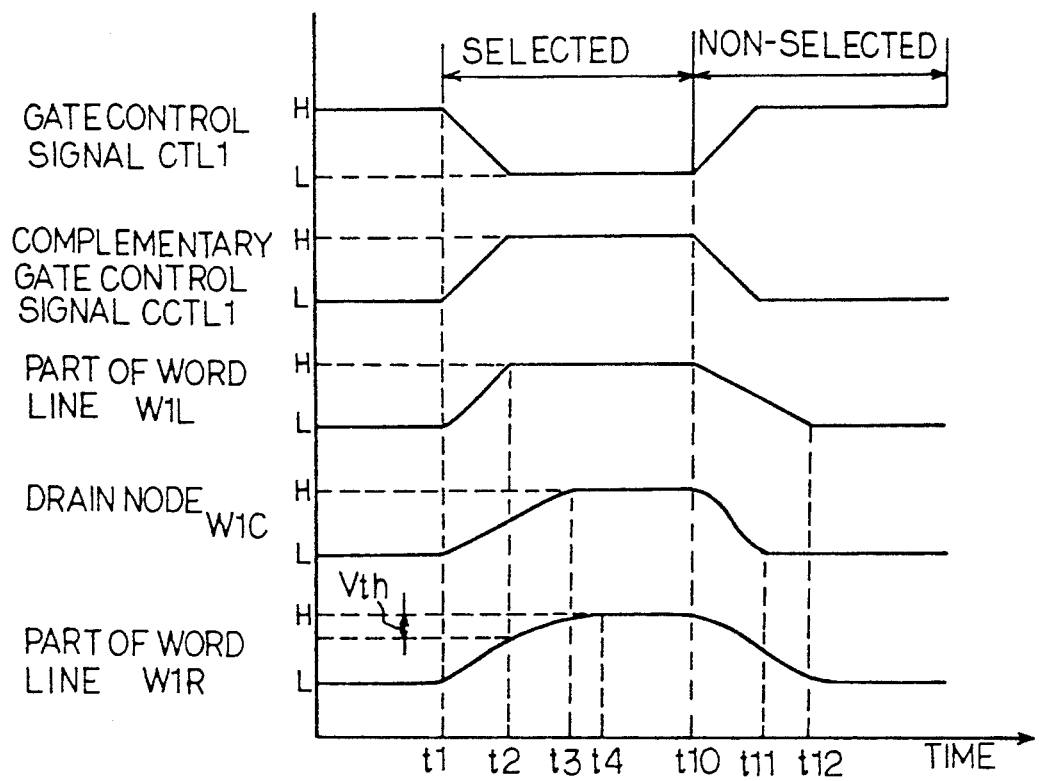
FIG. 7 is a diagram showing the waveforms at the output node of the row address decoder sub-unit as well as the word line selected by the prior art row address decoder and word line driver unit.
Figure 8:
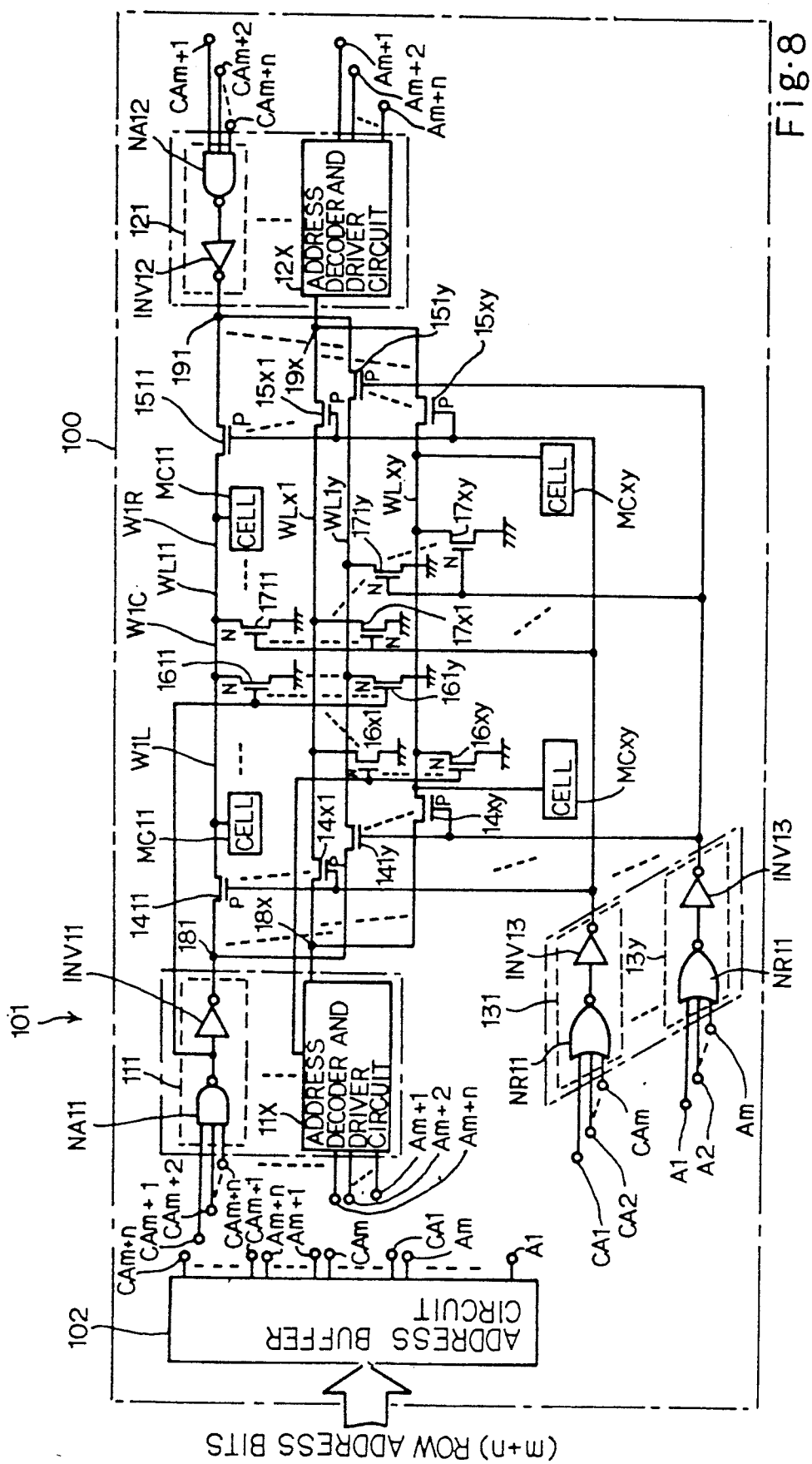
FIG. 8 is a circuit diagram showing the arrangement of a row address decoder and word line driver unit according to the present invention.
Figure 9:
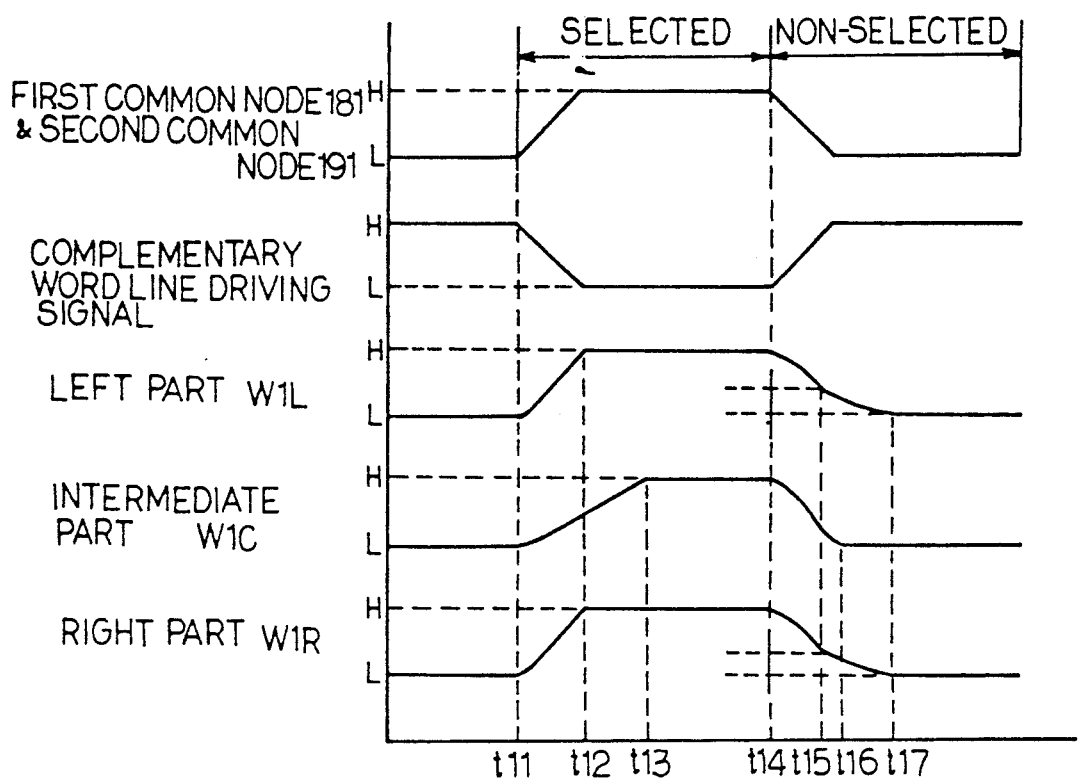
FIG. 9 is a diagram showing the waveforms on a word line driven by an address decoder and word line driver sub-unit incorporated in the row address decoder and word line driver unit according to the present invention.

Referring to FIG. 8 of the drawings, a semiconductor memory device is fabricated on a semiconductor chip 100, and a row address decoder and word line driver unit 101 is incorporated in the semiconductor memory device. The row address decoder and word line driver unit 101 is associated with a plurality sets of word lines WL11 to WL1y, ... and WLx1 to WLxy, and the word lines WL11 to WLx1, ... and WL1y to WLxy form a plurality groups of word lines. The row address decoder and word line driver unit 101 is coupled with an address buffer circuit 102, and (m+n) row address bits are predecoded by the address buffer circuit 102 to address predecoded signals A1 to Am, CA1 to CAm, Am+1 to Am+n and CAm+1 to CAm+n. The address predecoded signals CA1 to CAm and CAm+1 to CAm+n are complementary signals of the address predecoded signals A1 to Am and Am+1 to Am+n, respectively. Rows of memory cells are respectively coupled with the word lines WL11 to WLxy, and the rows of memory cells coupled with the word lines WL11 and WLxy are labeled with MC11 and MCxy, respectively. The other rows of memory cells are deleted from FIG. 8 for the sake of simplicity. Of course, other units and signal lines such as a column address unit and bit lines are further incorporated in the semiconductor memory device. However, these units and signal lines are also deleted from FIG. 8, because they are less important for understanding the present invention.

The row address decoder and word line driver unit 101 largely comprises a plurality of first address decoder and driver circuits 111 to 11x, a plurality of second address decoder and driver circuits 121 to 12x, a plurality of address decoder sub-units 131 to 13y, a plurality groups of p-channel enhancement type first transfer transistors 1411 to 14x1, ... and 141y to 14xy, a plurality groups of p-channel enhancement type second transfer transistors 1511 to 15x1, ... and 151y to 15xy, a plurality sets of n-channel enhancement type first pull-down transistors 1611 to 161y, ... and 16x1 to 16xy, and a plurality groups of n-channel enhancement type second pull-down transistors 1711 to 17x1, ... and 171y to 17xy. The n-channel enhancement type first transistors 1611 to 16xy and the n-channel enhancement type second transistors 1711 to 17xy serve as first switching transistors and second switching transistors, respectively.

The plurality of first address decoder and driver circuits 111 to 11x are respectively paired with the plurality of second address decoder and driver circuits 121 to 12x, and the first address decoder and driver circuits 111 to 11x and the second address decoder and driver circuits 121 to 12x respectively paired form a plurality of row address decoder and word line driver sub-units. The plurality of row address decoder and word line driver sub-units are respectively associated with the plurality sets of word lines WL11 to WL1y, ... and WLx1 to WLxy, and selectively drive first common nodes 181 to 18x and second common nodes 191 to 19x to active high voltage level approximately equal to a positive power voltage level Vcc.

The plurality of first address decoder and driver circuits 111 to 11x are similar in arrangement to one another, and each first address decoder and driver circuit is implemented by a series combination of m-input NAND gate NA11 and an inverter INV11. The plurality of second address decoder and driver circuits 121 to 12x are also similar in arrangement to one another, and each second address decoder and driver circuit is implemented by a series combination of m-input NAND gate NA12 and an inverter INV12.

The address predecoded signals Am+1 to Am+n and CAm+1 to CAm+n are broken down to x combinations of address predecoded signals, and each of the x combinations is distributed to each row address decoder and word line driver sub-unit. For example, the combination of the address predecoded signals CAm+1, CAm+2, . . . and CAm+n are supplied to the NAND gates NA11 and NA12 of the first and second address decoder and driver circuits 111 and 121, and the combination of the address predecoded signals Am+1, Am+2, . . . and Am+n are supplied to the first and second address decoder and driver circuits 11x and 12x. Only one combination of address predecoded signals consists of logic "1" bits, and, accordingly, only one of the row address decoder and word line driver sub-units drives the associated first common node and the associated second common node to the high voltage level. Since each first common node and each second common node are shared between one of the plurality sets of word lines, the high voltage level is propagated to the associated set of word lines.

The plurality of address decoder sub-units 131 to 13y are respectively associated with the plurality groups of word lines WL11 to WLx1, . . . and WL1y to WLxy, and one of the plurality of address decoder sub-units 131 to 13y is responsive to the address predecoded signals A1 to Am and CA1 to CAm for producing a gate control signal. In detail, each of the address decoder sub-units 131 to 13y is implemented by a series combination of n-input NOR gate NR11 and INV13, and the address predecoded signals A1 to Am and CA1 to CAm are broken down into y combinations of address predecoded signals. The y combinations of address predecoded signals are respectively supplied to the address decoder sub-units 131 to 13y. For example, the combination of address predecoded signals A1, A2, . . . and Am is supplied to the NOR gate of the address decoder sub-unit 13y, and the combination of address predecoded signals CA1, CA2, . . . and CAm is supplied to the NOR gate NR11 of the address decoder sub-unit 131. Only one of the y combinations consists of logic "0" bits, and the associated address decoder sub-unit produces the gate control signal of active ground voltage level.

The plurality groups of p-channel enhancement type first transfer transistors 1411 to 14xy and the plurality groups of p-channel enhancement type second transfer transistors 1511 to 15xy are associated with the plurality groups of word lines WL11 to WLx1, . . . and WL1y to WLxy and, accordingly, with the plurality of address decoder and driver sub-units 131 to 13y, and each of the plurality of address decoder and driver sub-units 131 to 13y is coupled with the gate electrodes of each group of p-channel enhancement type first transfer transistors 1411 to 14xy and to each group of p-channel enhancement type second transfer transistors 1511 to 15xY. The address predecoded signals A1 to Am and CA1 to CAm allow one of the plurality groups of p-channel enhancement type first transfer transistors 1411 to 14xy and one of the plurality groups of p-channel enhancement type second transfer transistors 1511 to 15xy to turn on, and a pair of first and second common nodes is coupled with one of the plurality groups of word lines WL11 to WLx1, . . . and WL1y to WLxy.

The plurality sets of n-channel enhancement type first pull-down transistors 1611 to 161y, . . . and 16x1 to 16xy are respectively associated with the plurality sets of word lines WL11 to WL1y, . . . and WLx1 to WLxy, and are coupled between the plurality sets of word lines WL11 to WLxy and a ground voltage line. The plurality of first address decoder and word line driver circuits 111 to 11x are associated with the plurality sets of n-channel enhancement type first pull-down transistors 1611 to 16xy, and the output nodes of the NAND gates NA11 are coupled with the gate electrodes of the plurality sets of word lines WL11 to WL1y, . . . and WLx1 to WLxy. For this reason, the complementary word line driving signals are supplied to non-selected sets of n-channel enhancement type first pull-down transistors, and the non-selected sets of word lines are conducted with the ground voltage line.

The plurality groups of n-channel enhancement type second pull-down transistors 1711 to 17x1, . . . and 171y to 17xy are respectively associated with the plurality groups of word lines WL11 to WLx1, . . . and WL1y to WLxy, and are coupled between the plurality groups of word lines WL11 to WLxy and the ground voltage line. The plurality of address decoder sub-units 131 to 13y are associated with the plurality groups of n-channel enhancement type second pull-down transistors 1711 to 17xy, and the output nodes of the inverters INV13 are coupled with the gate electrodes of the plurality groups of word lines WL11 to WLx1, . . . and WL1y to WLxy. For this reason, non-selected groups of n-channel enhancement type second pull-down transistors turn on in the absence of the gate control signal, and are conducted with the ground voltage line.

The row address decoder and word line driver unit 101 thus arranged microscopically behaves as follows. In Figs. W1L, W1R and W1C stand for the left part, the intermediate part and the right part of the word line WL11. The left part W1L extends between the p-channel enhancement type first transfer transistor 1411 and the n-channel enhancement type first pull-down transistor 1611, the intermediate part W1C is between the n-channel enhancement type first pull-down transistor 1611 and the n-channel enhancement type second pull-down transistor 1711, the right part W1R is between the n-channel enhancement type second pull-down transistor 1711 and the p-channel enhancement type second transfer transistor 1511.

Assuming now that the address predecoded signals Am+1 to Am+n and CAm+1 to CAm+n and the address predecoded signals A1 to Am and CA1 to CAm are indicative of the first and second row address decoder and driver circuits 111 and 121 and the address decoder sub-unit 131, the first and second row address decoder and word line driver circuits 111 and 121 supply the word line driving signal of the high voltage level to the first and second common nodes 181 and 191 at time t11, and the address decoder sub-unit 131 concurrently shifts the gate control signal to the active low voltage level. The selected first row address decoder and word line driver circuit 111 further produces the complementary word line driving signal of the active ground voltage level, and the non-selected first row address decoder and word line driver circuits keep the complementary word line driver signals in the inactive high voltage level. The other first and second row address decoder and word line driver circuits keep the associated first and second common nodes such as 18x and 19x in the ground voltage level, and the other address decoder sub-units keep the output nodes thereof in the high voltage level.

As a result, the bias voltage Vgs approximately equal to −Vcc is fixedly applied to the gate electrodes of the p-channel enhancement type first and second transfer transistors 1411 and 1511, and currents rapidly flow from the first and second common nodes 181 and 191 against small channel resistances of the p-channel enhancement type first and second transfer transistors 1411 and 1511. The bias voltage approximately equal to Vcc is fixedly applied to the gate electrode of the n-channel enhancement type first and second pull-down transistors 1611 and 1711, and the n-channel enhancement type first and second pull-down transistors 1611 and 1711 rapidly turn off. For this reason, the left and right parts W1L and W1R rise at high speed, and reach the high voltage level approximately equal to the power voltage level Vcc at time t12. Finally, the intermediate part W1C reaches the high voltage level at time t13.

If the address predecoded signals Am+1 to Am+n and CAm+1 to CAm+n select another row address decoder and word line driver sub-unit such as 11x and 12x, the first and second common nodes 181 and 191 are decayed at time t14, and the complementary word line driving signal is recovered from the ground voltage level to the high voltage level. Since the differential voltage Vds is equal to the bias voltage Vgs, the p-channel enhancement type first and second transfer transistors 1411 and 1511 behave in the saturation region, and the channel resistances thereof are relatively high. On the other hand, the bias voltage Vgs approximately equal to Vcc is applied to the gate electrode of the n-channel enhancement type first pull-down transistor 1611, and the channel resistance thereof is relatively small. Then, the intermediate part W1C is decayed at the fastest speed. However, the p-channel enhancement type first and second transfer transistors 1411 and 1511 turn off at time t15, because the bias voltage Vgs reaches the threshold level. As a result, the n-channel enhancement type first pull-down transistor 1611 discharges electric charges, and the intermediate part W1C reaches the ground voltage level at time t16. A small amount of time delay is introduced in the voltage drop on the left and right parts W1L and W1R, and the left and right parts W1L and W1R reach the ground voltage level at time t17.

Figure 10:
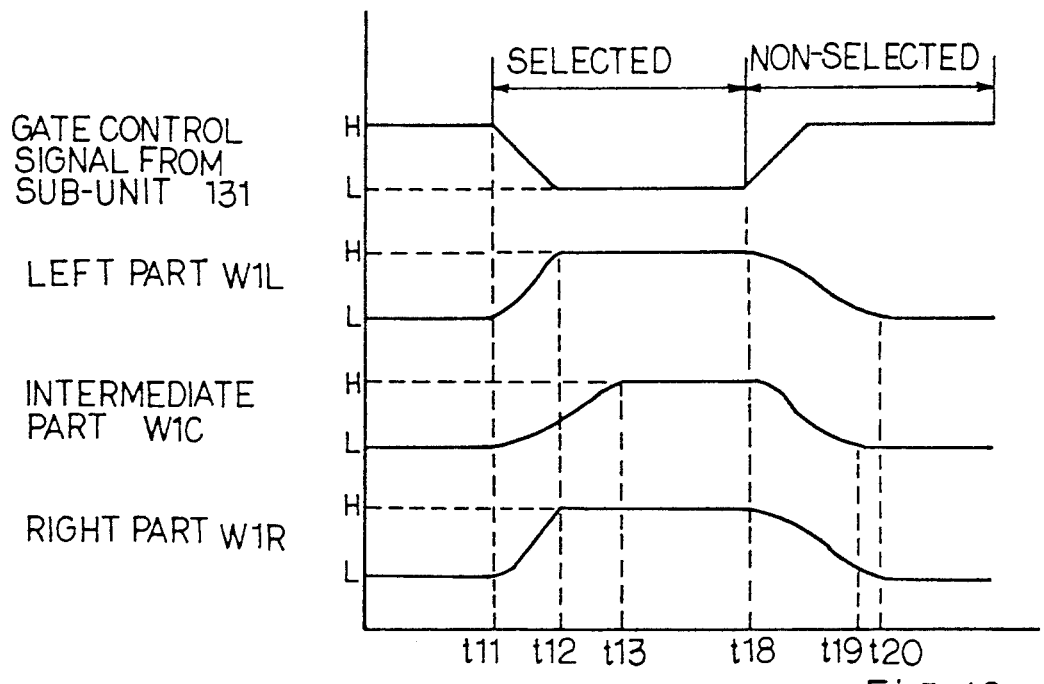
FIG. 10 is a diagram showing the waveforms on a word line driven by an address decoder sub-unit incorporated in the row address decoder and word line driver unit according to the present invention.

On the other hand, while the first and second row address decoder and word line driver circuits 111 and 121 keep the first and second common nodes 181 and 191 high, the address predecoded signals A1 to Am and CA1 to CAm change the selection from the address decoder sub-unit 131 to another address decoder sub-unit, and the inverter INV13 of the address decoder sub-unit 131 lifts the output node thereof to the high voltage level at time t18 as shown in FIG. 10. The p-channel enhancement type first and second transfer transistors 1411 and 1511 turn off, and the n-channel enhancement type first pull-down transistor 1611 keeps off. However, the bias voltage Vgs approximately equal to Vcc is applied to the gate electrode of the n-channel enhancement type second pull-down transistor 1711, and the n-channel enhancement type second pull-down transistor 1711 rapidly turns on so as to discharge electric charges from the word line WL1 to the ground voltage line. Since the intermediate part W1C is the closest to the n-channel enhancement type second pull-down transistor 1711, the intermediate part W1C reaches the ground voltage level at time t19, and the left and right parts W1L and W1R reach the ground voltage level at time t20.

As described hereinbefore, the p-channel enhancement type transfer transistors operable in the saturation region change a selected word line, and one of the n-channel enhancement type pull-down transistors operable in the saturation region discharges the selected word line. As a result, the row address decoder and word line driver unit according to the present invention rapidly selects one of the word lines, and the access time is shrunk by virtue of the rapid selection.

Second Embodiment

Figure 11:
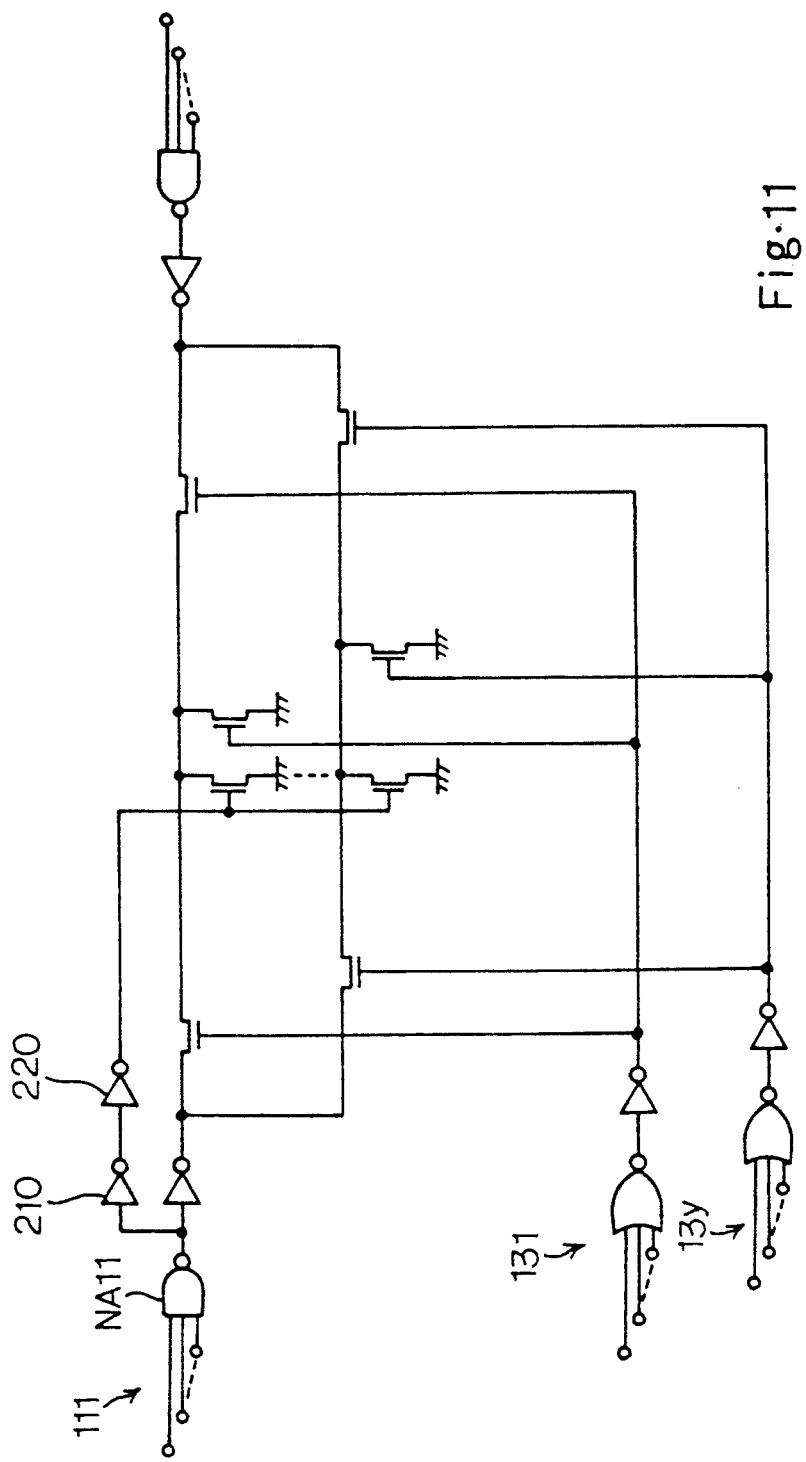
FIG. 11 is a block diagram showing the arrangement of another row address decoder and word line driver unit according to the present invention.

Turning to 11 of the drawings, another row address decoder and word line driver unit embodying the present invention is illustrated. Although only one row address decoder and word line driver sub-unit 111 and only two address decoder sub-units 131 and 13y are shown in FIG. 11, the second embodiment is similar in arrangement to the first embodiment except for inverters 210 and 220, and other circuit components are labeled with the same references as the corresponding circuit components of the first embodiment.

The inverters 210 and 220 are incorporated in the first row address decoder and word line driver circuit 111, and the output node of the NAND gate NA11 is coupled with the input node of the inverter 210. The output node of the inverter 220 is coupled with the n-channel enhancement type first pull-down transistors associated with the set of word lines WL11 to WL1y, and the inverter 220 produces the complementary word line driving signal.

The inverters 210 and 220 speed up the voltage change at the associated first common node 181. In detail, the NAND gate NA11 of the first embodiment is expected to drive the capacitive load coupled at the input node of the inverter INV11 as well as the capacitive load as y times larger the gate capacitance of the n-channel enhancement type first pull-down transistor. However, the NAND gate NA11 of the second embodiment only drives the capacitive loads respectively coupled with the two inverters INV11 and 210, and, for this reason, the NAND gate NA11 switches the output level at high speed.

Although particular embodiments of the present invention have been shown and described, it will be obvious to those skilled in the art that various changes and modifications may be made without departing from the spirit and scope of the present invention. For example, the channel conductivity types are exchangeable together with the high voltage line and the low voltage line. Moreover, the memory cells may be of a dynamic random access type, a static random access type, a floating gate type or any other type known to a person skilled in the art.

What is claimed is:

1. A row address decoder and word line driver unit for selectively driving a plurality sets of word lines, word lines respectively selected from said plurality sets of word lines forming in combination a group of word lines so that said plurality sets of word lines being rearranged into a plurality groups of word lines, comprising:

a) a plurality of row address decoder and word line driver sub-units respectively associated with said plurality sets of word lines, and having a-1) a plurality of first address decoder and driver circuits respectively coupled with first common nodes each shared between one of said plurality sets of word lines, and a-2) a plurality of second address decoder and driver circuits respectively paired with said plurality of first address decoder and driver circuits, and respectively coupled with second common nodes each shared between one of said plurality sets of word lines at the opposite ends to said first common nodes, said plurality of first address decoder and driver circuits and said plurality of second address decoder and driver circuits being responsive to first address predecoded signals for supplying a word line driving signal to one of said first common nodes and one of said second common nodes, a complementary signal of said word line driving signal being produced by one of said plurality of first address decoder and driver circuits;

b) a plurality of row address decoder sub-units respectively associated with said plurality groups of word lines, and responsive to second address predecoded signals for producing a gate control signal;

c) a plurality groups of first transfer transistors of one channel conductivity type respectively associated with said plurality of row address decoder sub-units, and respectively coupled between said first common nodes and said plurality groups of word lines, one of said plurality groups of first transfer transistors indicated by said second address predecoded signals being responsive to said gate control signal for coupling said first common nodes with the associated group of word lines;

d) a plurality groups of second transfer transistors of said one channel conductivity type respectively associated with said plurality of row address decoder sub-units, and respectively coupled between said second common nodes and said plurality groups of word lines, one of said plurality groups of second transfer transistors indicated by said second address predecoded signals being responsive to said gate control signal for coupling said second common nodes with the associated group of word lines;

e) a plurality sets of first switching transistors of the opposite channel conductivity type respectively associated with said plurality of first address decoder and driver circuits, and respectively coupled between said plurality sets of word lines and a constant voltage line, one of said plurality sets of first switching transistors being responsive to said complementary signal of said word line driving signal for coupling the associated set of word lines with said constant voltage line; and f) a plurality groups of second switching transistors of said opposite channel conductivity type respectively associated with said plurality of address decoder sub-units, and respectively coupled between said plurality groups of word lines and said constant voltage line, one of said plurality groups of second switching transistors being responsive to said gate control signal for coupling the associated group of word lines with said constant voltage line.

2. A row address decoder and word line driver unit as set forth in claim 1, in which each of said plurality of first address decoder and driver circuits comprises a series combination of a first NAND gate and a first inverter, and each of said plurality of second address decoder and driver circuits is implemented by a series combination of a second NAND gate and a second inverter.

3. A row address decoder and word line driver unit as set forth in claim 2, in which each of said row address decoder sub-units is implemented by a series combination of a NOR gate and a third inverter.

4. A row address decoder and word line driver unit as set forth in claim 3, in which said one channel conductivity type and said opposite channel conductivity type are featured by an acceptor impurity and a donor impurity, respectively.

5. A row address decoder and word line driver unit as set forth in claim 4, in which each of said plurality of first row address decoder and driver circuits further comprises a series combination of third inverters coupled between the output node of said first NAND gate and the gate electrodes of the associated set of word lines.

* * * * *

UNITED STATES PATENT AND TRADEMARK OFFICE
CERTIFICATE OF CORRECTION

PATENT NO. : 5,295,116
DATED : March 15, 1994
INVENTOR(S) : Shinichi IWASHITA

It is certified that error appears in the above-indentified patent and that said Letters Patent is hereby corrected as shown below:

Col. 2, line 5, delete "2m" and insert --$2^m$--;
Col. 2, line 65, delete "111" and insert --11L--.

Signed and Sealed this

Fourth Day of October, 1994

BRUCE LEHMAN

Attest:

Attesting Officer

Commissioner of Patents and Trademarks